United States Patent [19]
Liu et al.

[11] Patent Number: 5,756,241
[45] Date of Patent: May 26, 1998

[54] SELF-ALIGNED METHOD FOR FORMING A COLOR DISPLAY SCREEN

[75] Inventors: Nan-Chou David Liu, Chutung; Jin-Yuh Lu, Taipei, both of Taiwan

[73] Assignee: Industrial Technology Research Institute, Hsin-Chu, Taiwan

[21] Appl. No.: 629,116

[22] Filed: Apr. 8, 1996

[51] Int. Cl.⁶ ........................................ G03C 5/00
[52] U.S. Cl. ........................ 430/24; 430/25; 430/26; 430/7; 430/394; 427/68; 427/71; 313/467; 313/470
[58] Field of Search ..................... 430/23–29, 7, 430/394; 313/461, 467, 468, 469, 470, 472; 427/68, 64, 71

[56] References Cited

U.S. PATENT DOCUMENTS

| | | | |
|---|---|---|---|
| 3,275,466 | 9/1966 | Kell | 313/473 |
| 4,139,657 | 2/1979 | Watanabe | 430/23 |
| 4,251,610 | 2/1981 | Haven et al. | 430/25 |
| 5,081,394 | 1/1992 | Morishita et al. | 313/466 |
| 5,214,541 | 5/1993 | Yamasita et al. | 430/7 |
| 5,334,468 | 8/1994 | Yamasita et al. | 430/7 |
| 5,439,582 | 8/1995 | Oka et al. | 430/7 |
| 5,469,018 | 11/1995 | Jacobsen et al. | 313/461 |
| 5,527,648 | 6/1996 | Otsuki et al. | 430/7 |

FOREIGN PATENT DOCUMENTS 3-250530  11/1991  Japan ................ 430/27

*Primary Examiner*—Martin Angebranndt
*Attorney, Agent, or Firm*—George O. Saile; Stephen B. Ackerman

[57] ABSTRACT

For the manufacture of a color screen for a cathode ray tube a process is described which uses a single photolithographic mask for defining multiple patterns, so that said single mask may be used for determining the different areas where several different phosphor layers will be located. Masks used for conventional photolithographic processes normally comprise a pattern of regions that are either fully transparent or fully opaque to the radiation used for exposing the resist. The mask used as part of the present invention includes regions that are neither fully transparent nor fully opaque, having, instead, a grey scale of optical densities. Through careful control of both exposure and development time, selected parts of a layer of a positive photoresist, that were exposed through successively denser regions of the mask, can be successively removed. As each of these parts of the resist is removed, parts of an underlying layer of adhesive are uncovered and then serve as selective sites for the application of phosphor particles. The process may be used with or without the inclusion of a black matrix as part of the structure.

22 Claims, 2 Drawing Sheets

SELF-ALIGNED METHOD FOR FORMING A COLOR DISPLAY SCREEN

BACKGROUND OF THE INVENTION

(1) Field of the Invention

The invention relates to the general field of color screens for cathode ray tubes and flat panel displays and to methods for preparing same.

(2) Description of the Prior Art

Color screens for cathode ray tubes comprise, in essence, a plurality of small regions each covered by a layer of phosphor. Usually three different color-generating phosphors are used, one for blue light, one for red light and one for green light. Said regions act as sub-pixels for the display and their possible shapes include dots and stripes.

The various regions that constitute the sub-pixels are arranged so as not to overlap with one another. In order to see that no light can emerge from within the display tube through the space between the sub-pixels said space is sometimes filled with a non-reflecting, non-transmitting layer called a black matrix. It is also possible, however, to forego the use of a black matrix if the technique used for depositing the various sub-pixel regions is precise enough for the space between them to be kept very small. While such very tight control of deposited areas is possible using, for example, photolithographic techniques, it is equally important that they be applied in manner that is not too expensive.

A variety of methods exist for depositing the phosphor layers, the most common being in the form of a slurry or as a dry powder onto an adhesive surface. In all cases, material that is extraneous to the phosphor, such as the binder for the slurry or the adhesive for the dry powder, need to be removed prior to sealing the screen under permanent vacuum. If this is not done, these materials will continue to outgas inside the vacuum and reduce its effectiveness. Removal is most commonly effected by heating in air or oxygen.

As already indicated, when tight control in the formation of the phosphor areas is needed, photolithographic methods are to be preferred. In one approach, an etch resistant layer is deposited and patterned to form an etch mask on a pre-deposited layer of phosphor. Alternatively, a type of offset printing may be used wherein an adhesive layer is first deposited and then etched to form isolated islands of adhesive to which phosphor particles, applied by dusting, sedimentation, or similar methods, then selectively stick. For all of these methods, it has been prior art practice to use a separate photolithographic mask for each different phosphor that is involved in the process. The ability to use a single photolithographic mask for the formation of all three phosphor regions offers obvious economic advantages. Such a capability is a key feature of the present invention.

As an example of the prior art we may cite Morishita et al. (U.S. Pat. No. 5,081,394 JAN 1992) which describes the fabrication of a black matrix color picture tube using a shadow mask to define the locations of the various phosphor regions.

SUMMARY OF THE INVENTION

It has been an object of the present invention to provide a method for manufacturing a color screen for a cathode ray tube that has lower cost than current methods, without foregoing the level of precision associated with currently used manufacturing methods.

A further object of the present invention has been to provide a method that is equally applicable to tubes that do or do not feature a black matrix.

These objects have been achieved by means of a process which uses a single photolithographic mask for defining multiple patterns, so that said single mask may be used for determining the different areas where several different phosphor layers will be located. Masks used for conventional photolithographic processes normally comprise a pattern of regions that are either fully transparent or fully opaque to the radiation used for exposing the resist. The mask used as part of the present invention includes regions that are neither fully transparent nor fully opaque, having instead a grey scale of optical densities. Through careful control of both exposure and development time, selected parts of a positive or negative photoresist, that were exposed through successively denser regions of the mask, can be successively removed. As each of these parts of the resist is removed, parts of an underlying layer of adhesive are uncovered and then serve as selective sites for the application of phosphor particles.

DESCRIPTION OF THE PREFERRED EMBODIMENTS

The present invention retains the precision achievable with photolithographic methods but reduces the cost associated with such methods by using a single photolithographic mask for the formation of the three (or more) different sub-pixel areas.

Figure 1:
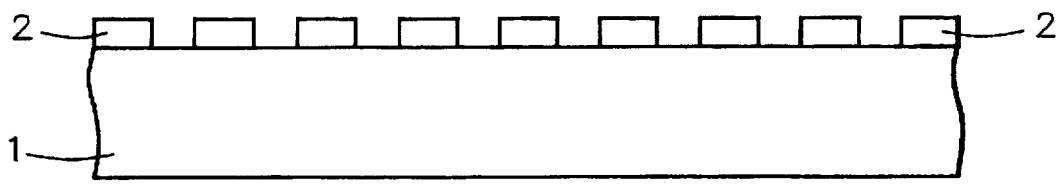
FIGS. 1 through 6 illustrate, through schematic cross-sections, successive steps in the manufacture of a color screen according to the method of the present invention.

Referring to FIG. 1, the process begins with the provision of suitable substrate 1 (usually glass) having a suitable surface, usually the inward-facing surface of the face plate of a cathode ray tube. Optionally, said surface may be coated with a layer of a transparent conductor such as indium-tin-oxide. A layer of a black opaque material is deposited onto said surface and is then patterned and etched to form black matrix 2. At this stage the structure has the appearance seen in schematic cross-section in FIG. 1.

Figure 2:
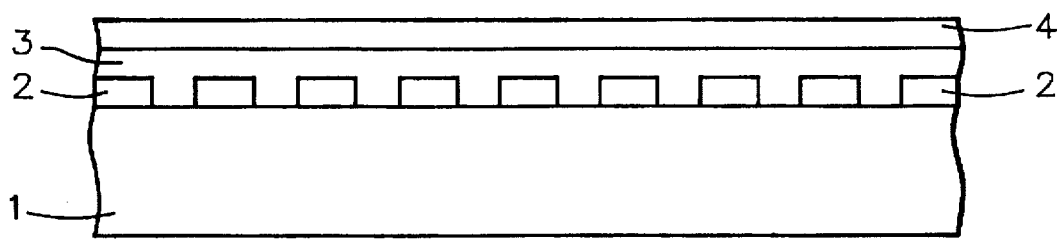

Following the formation of the black matrix, a layer of an adhesive material 3 such as an acrylic resin is applied so as to cover both the substrate surface and the black matrix. Our preferred method for applying the adhesive layer has been spin coating or laminating but any method for applying a uniform layer of thickness between about 10 and 50 microns could be used. With the adhesive layer in place, a layer of a positive photoresist 4 such as Novolac resin is applied, usually by spin coating or laminating, over it, giving the structure the appearance as illustrated in FIG. 2.

A positive photoresist is one that, prior to its exposure to suitable radiation (typically near-ultraviolet light), is insoluble in a developer (such as sodium hydroxide solution for example), but, after exposure becomes soluble. The increase in the solubility of the resist is not a step function but, rather, solubility increases with exposure time (following a minimum induction period). Thus, in general, it will take longer to fully develop (i.e. dissolve) resist that has received a brief exposure to radiation than to develop resist that has received a longer exposure.

Masks used for conventional photolithographic processes normally comprise a pattern of regions that are either fully transparent or fully opaque to the radiation used for exposing the resist. The masks used as part of the present invention include regions that may be neither fully transparent nor fully opaque. In other words, having a grey scale of optical densities.

In general, there will be one level of optical density in the mask (including fully transparent) for each different phosphor layer that is to be formed by the methodology of the present invention. Thus, in the common case of three different phosphors, three different optical densities would be needed in the mask, in addition to fully opaque. We will refer to these as fully transparent, largely transparent, and slightly transparent. For this particular embodiment, these three descriptive terms correspond to the following transmittances:

Fully transparent transmits 100% of incident radiation.
Largely transparent transmits between about 60 and 70%.
Slightly transparent transmits between about 30 and 40%.

Figure 3:
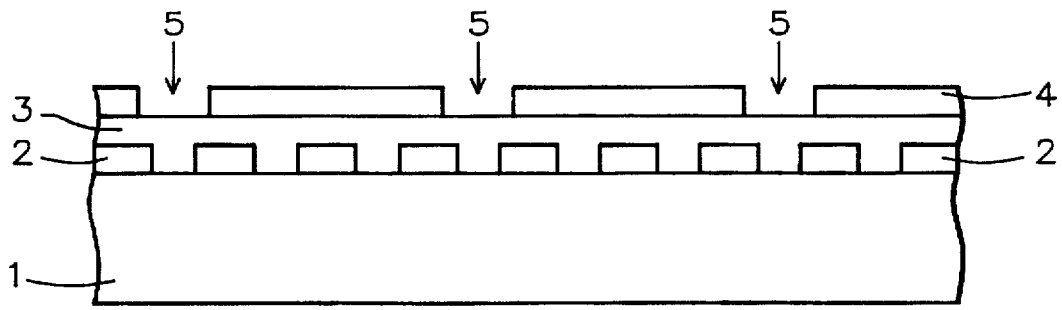

Referring now to FIG. 3, with the layer of positive photoresist 4 in place, said layer is exposed to suitable radiation through a mask (not shown). The duration of this first exposure time is controlled to be between about 0.5 and 1 minutes. Under these conditions, resist areas 5 that received radiation from the fully transparent parts of the mask will have been rendered readily soluble. Resist 4 that received radiation from other parts of the mask will, at this stage, still be either totally insoluble or only slightly soluble. By careful control of the development time, for example between about 1 and 1.5 minutes, resist 5 areas can be removed while leaving the rest of resist 4 intact, giving the structure the appearance seen in FIG. 3.

Figure 4:
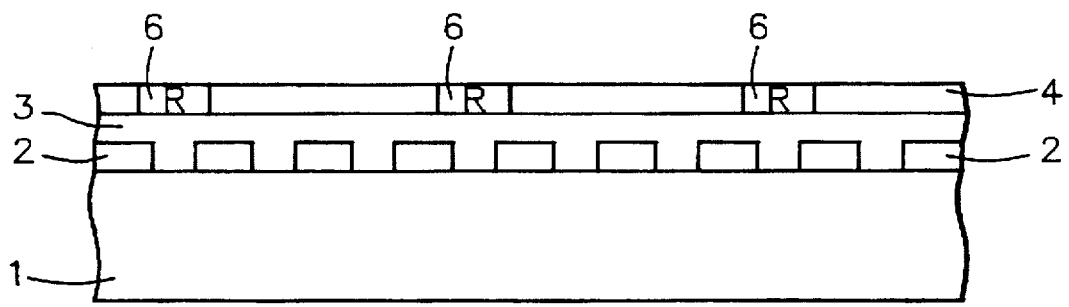

The removal of resist areas 5 uncovers the underlying adhesive layer 3 in regions where it is intended that the first of the three different phosphors (for example, but not necessarily, red) will go. Application of the phosphor to the substrate surface can be effected by any of several standard methods. These include dusting, wherein phosphor powder is blown onto the adhesive surface through a suitable nozzle, or sedimentation from a suspension of the phosphor in a binding fluid. Regardless of the method used for applying the phosphor, it is very important to use phosphor particles that both adhere well to the chosen adhesive layer (3) while at the same time not adhering to resist layer 4. The appearance of the structure after the selective application of (for example) red phosphor layer 6 is shown in FIG. 4.

With phosphor layer 6 in place, the structure is once again exposed to radiation, through the same mask as before, for a time period between about 0.5 and 1 minutes. Under these conditions, sufficient radiation will have reached the resist, by way of the largely transparent areas in the mask, for those areas to be rendered readily soluble in the developer. Again, by carefully controlling development time to be between about 1 and 1.5 minutes, additional parts of resist layer 4 will be selectively removed and adhesive layer 3 will be uncovered wherever it is intended that the second phosphor (for example green) is to adhere. Said second phosphor (designated 7 in FIG. 5) is then applied to the surface in a similar manner to that already used for first phosphor layer 6.

Figure 5:
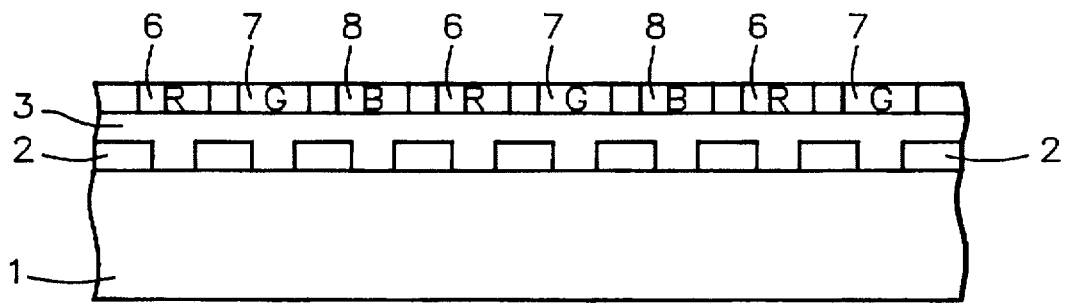

The process is now repeated for the application of the last phosphor layer (for example blue, designated 8 in FIG. 5) so that the structure has the appearance illustrated in FIG. 5. As before, the same mask is used. Exposure time is controlled to be between about 0.5 and 1 minutes and development time between about 1 and 1.5 minutes so that areas that received radiation through the slightly transparent areas of the mask are now selectively removed.

Figure 6:
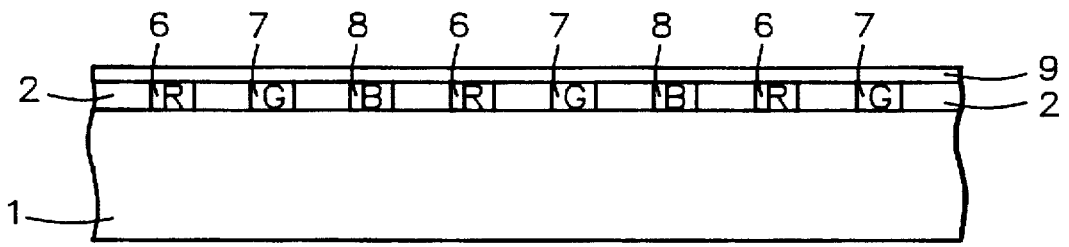

At this stage an optional coating of a lacquer such as acryl emulsion may be applied to the surface. The function of the lacquer layer is to planarize the surface in anticipation of the next step which is the deposition over the surface of a thin layer of aluminum (between about 1,500 and 2,500 Angstroms thick) which will serve as the anode for the imaging electrons. Finally, all potential sources of outgassing, notably the adhesive, the slurry binder (if used) and the optional lacquer, are removed by heating in air or oxygen for between about 60 and 120 minutes at a temperature between about 450° and 470° C. The structure then has the appearance illustrated in FIG. 6.

In a second embodiment of the present invention no black matrix is included. This could be done in situations where minimizing manufacturing cost is a prime consideration and a certain loss in display contrast (associated with the absence of the black matrix) can be tolerated. In all other respects, the process for manufacturing this embodiment is the same as has been described above for a structure that includes a black matrix.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a color screen for a cathode ray tube comprising:
   (a) providing a suitable substrate;
   (b) coating said substrate with a layer of a black material;
   (c) patterning and etching said layer of black material into the shape of a black matrix;
   (d) coating said substrate and black matrix with an adhesive layer;
   (e) then coating said adhesive layer with a layer of a positive photoresist;
   (f) providing a photolithographic mask having discrete regions that are fully transparent, largely transparent, slightly transparent, and opaque with respect to radiation that affects the solubility of said layer of positive photoresist;
   (g) exposing said positive photoresist layer to said radiation through said photolithographic mask for a first period of time;
   (h) developing said layer of positive photoresist for a period of time that is just long enough to cause dissolution of those areas that were exposed through said fully transparent regions of said mask;
   (i) applying a first phosphor layer to the substrate, so that said first phosphor adheres only in areas where said adhesive layer is not covered;
   (j) exposing said positive photoresist layer to said radiation through said photolithographic mask for a second period of time;
   (k) developing said layer of positive photoresist for a period of time that is just long enough to cause dissolution of those areas that were exposed through said largely transparent regions of said mask;
   (l) applying a second phosphor layer to the substrate, so that said second phosphor adheres only in areas where said adhesive layer is not covered;
   (m) exposing said positive photoresist layer to said radiation through said photolithographic mask for a third period of time;
   (n) developing said layer of positive photoresist for a period of time that is just long enough to cause dissolution of those areas that were exposed through said slightly transparent regions of said mask;

(o) applying a third phosphor layer to the substrate, so that said third phosphor adheres only in areas where said adhesive layer is not covered;

(p) coating said phosphor layers with a layer of aluminum; and (q) removing said adhesive layer by heating in an oxidizing atmosphere.

2. The method of claim 1 wherein said adhesive layer comprises an acrylic resin and is applied by means of spin coating or laminating.

3. The method of claim 1 wherein said positive photoresist comprises novolac resin and is applied my means of spin coating or laminating.

4. The method of claim 1 wherein the largely transparent regions of the photolithographic mask transmit between about 60 and 70% of said radiation.

5. The method of claim 1 wherein the slightly transparent regions of the photolithographic mask transmit between about 30 and 40% of said radiation.

6. The method of claim 1 wherein the first time period for which the positive photoresist is exposed is between about 0.5 and about 1 minutes.

7. The method of claim 1 wherein the second time period for which the positive photoresist is exposed is between about 0.5 and about 1 minutes.

8. The method of claim 1 wherein the third time period for which the positive photoresist is exposed is between about 0.5 and about 1 minutes.

9. The method of claim 1 wherein the phosphor layers comprise red, blue, and green phosphors.

10. The method of claim 1 wherein step (p) further comprises coating said phosphor layers with a layer of lacquer prior to applying the aluminum film and step (q) further comprises removing said lacquer layer.

11. The method of claim 1 wherein said substrate has been pre-coated with a layer of indium tin oxide.

12. A process for manufacturing a color screen for a cathode ray tube comprising:

(a) providing a suitable substrate;

(b) coating said substrate with an adhesive layer;

(c) then coating said adhesive layer with a layer of a positive photoresist;

(d) providing a photolithographic mask having discrete regions that are fully transparent, largely transparent, slightly transparent, and opaque with respect to radiation that affects the solubility of said layer of positive photoresist;

(e) exposing said positive photoresist layer to said radiation through said photolithographic mask for a first period of time;

(f) developing said layer of positive photoresist for a period of time that is just long enough to cause dissolution of those areas that were exposed through said fully transparent regions of said mask;

(g) applying a first phosphor layer to the substrate, so that said first phosphor adheres only in areas where said adhesive layer is not covered;

(h) exposing said positive photoresist layer to said radiation through said photolithographic mask for a second period of time;

(i) developing said layer of positive photoresist for a period of time that is just long enough to cause dissolution of those areas that were exposed through said largely transparent regions of said mask;

(j) applying a second phosphor layer to the substrate, so that said second phosphor adheres only in areas where said adhesive layer is not covered;

(k) exposing said positive photoresist layer to said radiation through said photolithographic mask for a third period of time;

(l) developing said layer of positive photoresist for a period of time that is just long enough to cause dissolution of those areas that were exposed through said slightly transparent regions of said mask;

(m) applying a third phosphor layer to the substrate, so that said third phosphor adheres only in areas where said adhesive layer is not covered;

(n) coating said phosphor layers with a layer of aluminum; and (o) removing said adhesive layer by heating in an oxidizing atmosphere.

13. The method of claim 12 wherein said adhesive layer comprises an acrylic resin and is applied my means of spin coating or laminating.

14. The method of claim 12 wherein said positive photoresist comprises novolac resin and is applied my means of spin coating or laminating.

15. The method of claim 12 wherein the largely transparent regions of the photolithographic mask transmit between about 60 and 70% of said radiation.

16. The method of claim 12 wherein the slightly transparent regions of the photolithographic mask transmit between about 30 and 40% of said radiation.

17. The method of claim 12 wherein the first time period for which the positive photoresist is exposed is between about 0.5 and about 1 minutes.

18. The method of claim 12 wherein the second time period for which the positive photoresist is exposed is between about 0.5 and about 1 minutes.

19. The method of claim 12 wherein the third time period for which the positive photoresist is exposed is between about 0.5 and about 1 minutes.

20. The method of claim 12 wherein the phosphor layers comprise red, blue, and green phosphors.

21. The method of claim 12 wherein step (n) further comprises coating said phosphor layers with a layer of lacquer prior to applying the aluminum film and step (o) further comprises removing said lacquer layer.

22. The method of claim 12 wherein said substrate has been pre-coated with a layer of indium tin oxide.

* * * * *